United States Patent
Yuan et al.

(10) Patent No.: US 9,257,191 B1
(45) Date of Patent: Feb. 9, 2016

(54) CHARGE REDISTRIBUTION DURING ERASE IN CHARGE TRAPPING MEMORY

(71) Applicant: SanDisk Technologies Inc., Plano, TX (US)

(72) Inventors: Jiahui Yuan, Fremont, CA (US); Ching-Huang Lu, Fremont, CA (US); Yingda Dong, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/472,889

(22) Filed: Aug. 29, 2014

(51) Int. Cl.
*G11C 16/04* (2006.01)
*G11C 16/14* (2006.01)
*G11C 16/26* (2006.01)
*G11C 16/34* (2006.01)

(52) U.S. Cl.
CPC ............ *G11C 16/14* (2013.01); *G11C 16/0466* (2013.01); *G11C 16/26* (2013.01); *G11C 16/3445* (2013.01)

(58) Field of Classification Search
CPC .... G11C 16/0483; G11C 16/16; G11C 16/14; G11C 16/344; G11C 11/5628; G11C 16/10; G11C 16/3454
USPC .............. 365/185.29, 185.17, 185.19, 185.22
See application file for complete search history.

(56) References Cited

U.S. PATENT DOCUMENTS

| | | | |
|---|---|---|---|
| 5,400,286 A | 3/1995 | Chu et al. | |
| 5,680,350 A | 10/1997 | Lee | |
| 6,834,012 B1 | 12/2004 | He et al. | |
| 6,967,873 B2 | 11/2005 | Hamilton et al. | |
| 7,272,050 B2 * | 9/2007 | Han et al. ................. | 365/185.22 |
| 7,924,610 B2 | 4/2011 | Chen et al. | |
| 8,199,585 B2 | 6/2012 | Marquart | |
| 8,213,233 B2 | 7/2012 | Sarin et al. | |
| 8,867,271 B2 * | 10/2014 | Li et al. ................... | 365/185.09 |
| 2008/0247228 A1 | 10/2008 | Nguyen et al. | |
| 2010/0128525 A1 | 5/2010 | Mokhlesi | |
| 2010/0259984 A1 | 10/2010 | Takeuchi | |
| 2011/0019483 A1 | 1/2011 | Lee et al. | |
| 2011/0242899 A1 | 10/2011 | Oowada et al. | |
| 2011/0286279 A1 | 11/2011 | Lei et al. | |
| 2014/0226414 A1 | 8/2014 | Costa et al. | |

OTHER PUBLICATIONS

Toledano-Luque, M., et al., "Resolving Fast Vth Transients After Program/Erase of Flash Memory Stacks and Their Relation to Electron and Hole Defects," IEEE Electron Devices Meeting (IEDM), Dec. 2009, pp. 1-4.
Lue et al., "Study of Charge Loss Mechanism of SONOS-Type Devices using Hot-Hole Erase and Methods to Improve the Charge Retention," IEEE International Reliability Physics Symposium Proceedings, Mar. 1, 2006, pp. 523-529.
International Search Report & The Written Opinion of the International Searching Authority dated Nov. 16, 2015, International Application No. PCT/US2015/043726.

* cited by examiner

*Primary Examiner* — David Lam
(74) *Attorney, Agent, or Firm* — Vierra Magen Marcus LLP

(57) ABSTRACT

Techniques are provided to accelerate the redistribution of the holes in connection with an erase operation, so that there will be a reduced amount of redistribution of the holes after programming. As a result, short-term charge loss after programming is reduced. In one aspect, a positive control gate voltage is applied to a set of memory cells after erase and before programming. The positive control gate voltage has a relatively low amplitude and a long duration, compared to a programming voltage. The positive control gate voltage can be adjusted based on the erase depth of the memory cells and factors such as a count of program-erase cycles, a count of erase-verify iterations, sensing of a position of the lower tail, and a cross-sectional width of a vertical pillar of a memory hole.

21 Claims, 15 Drawing Sheets

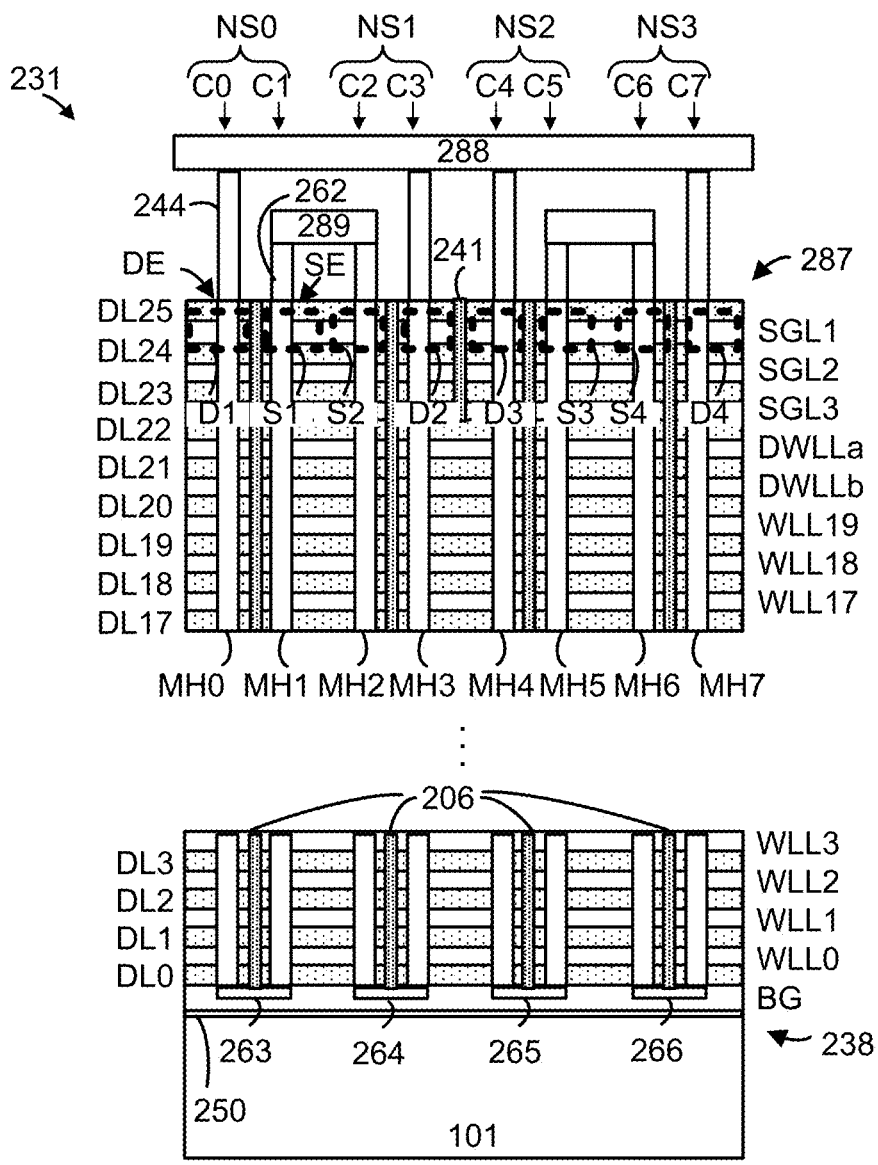

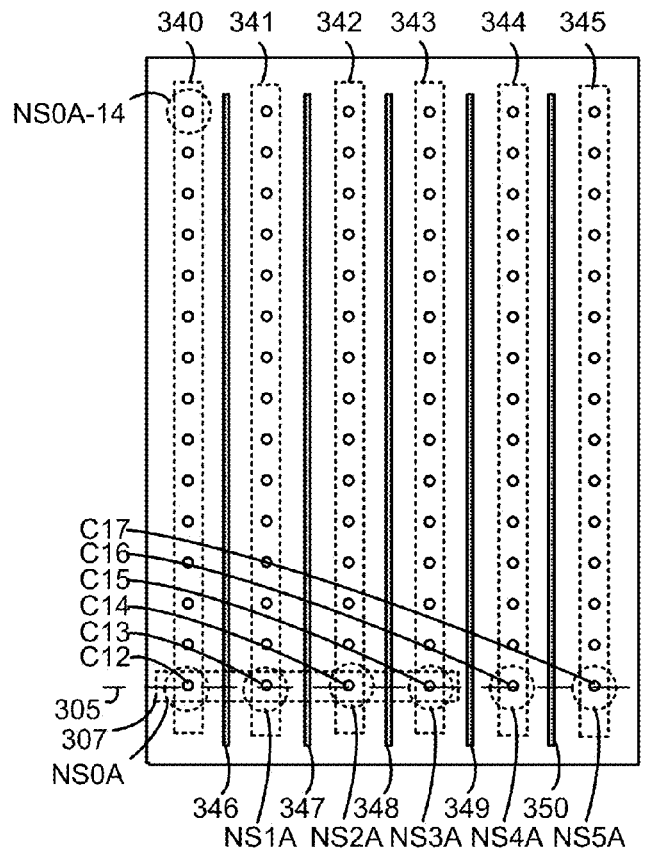
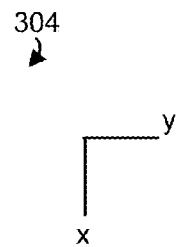
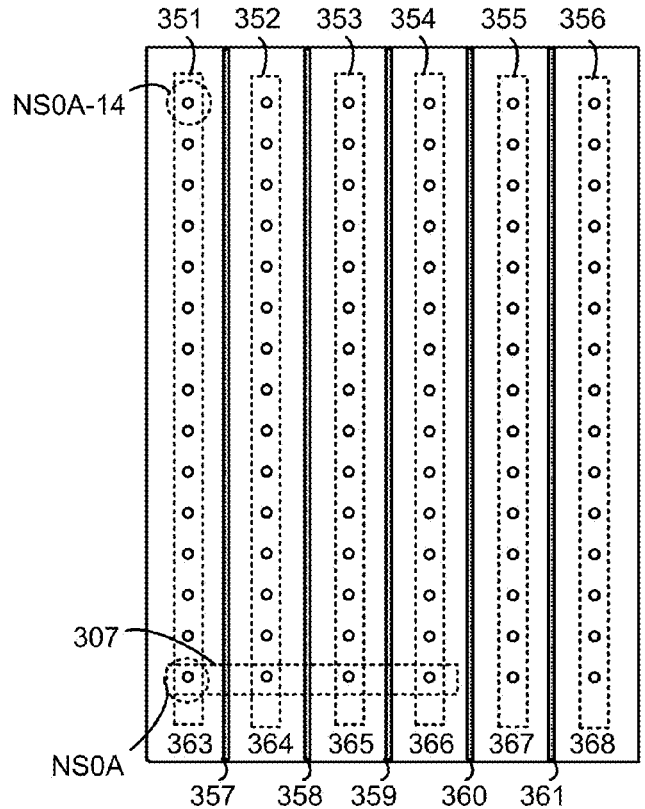
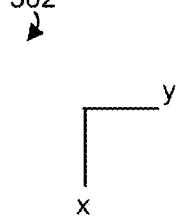

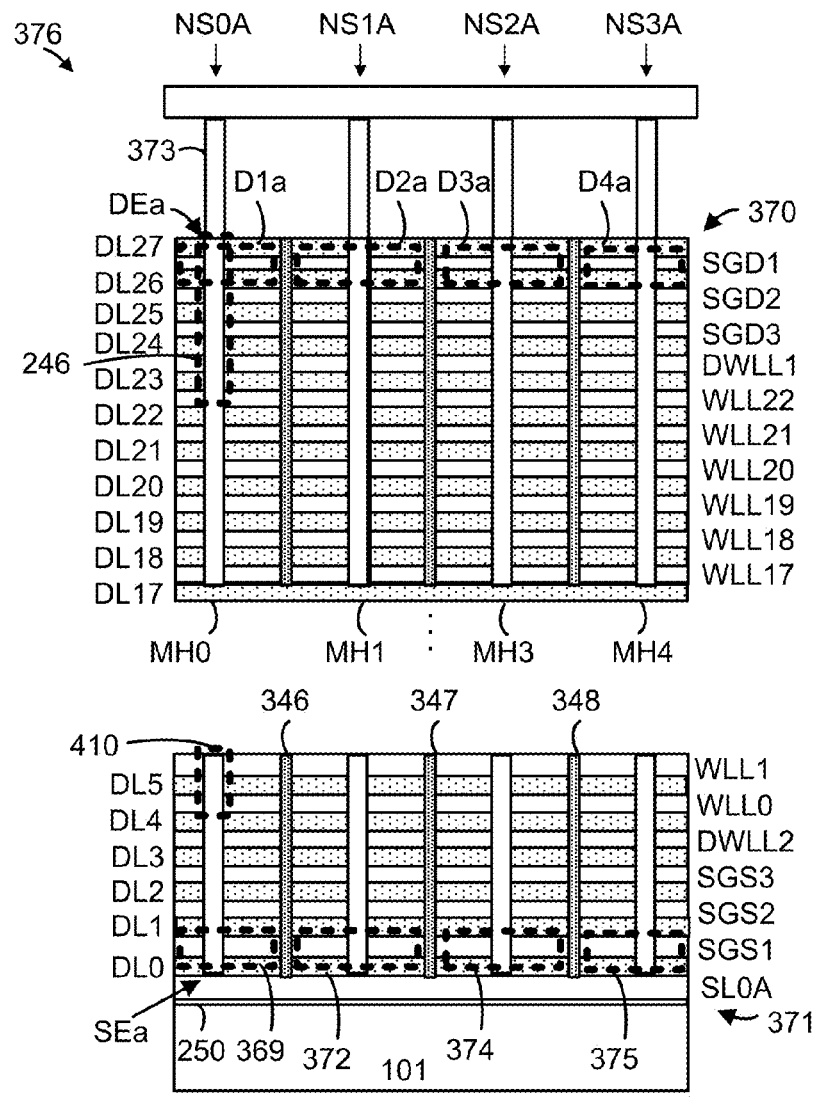

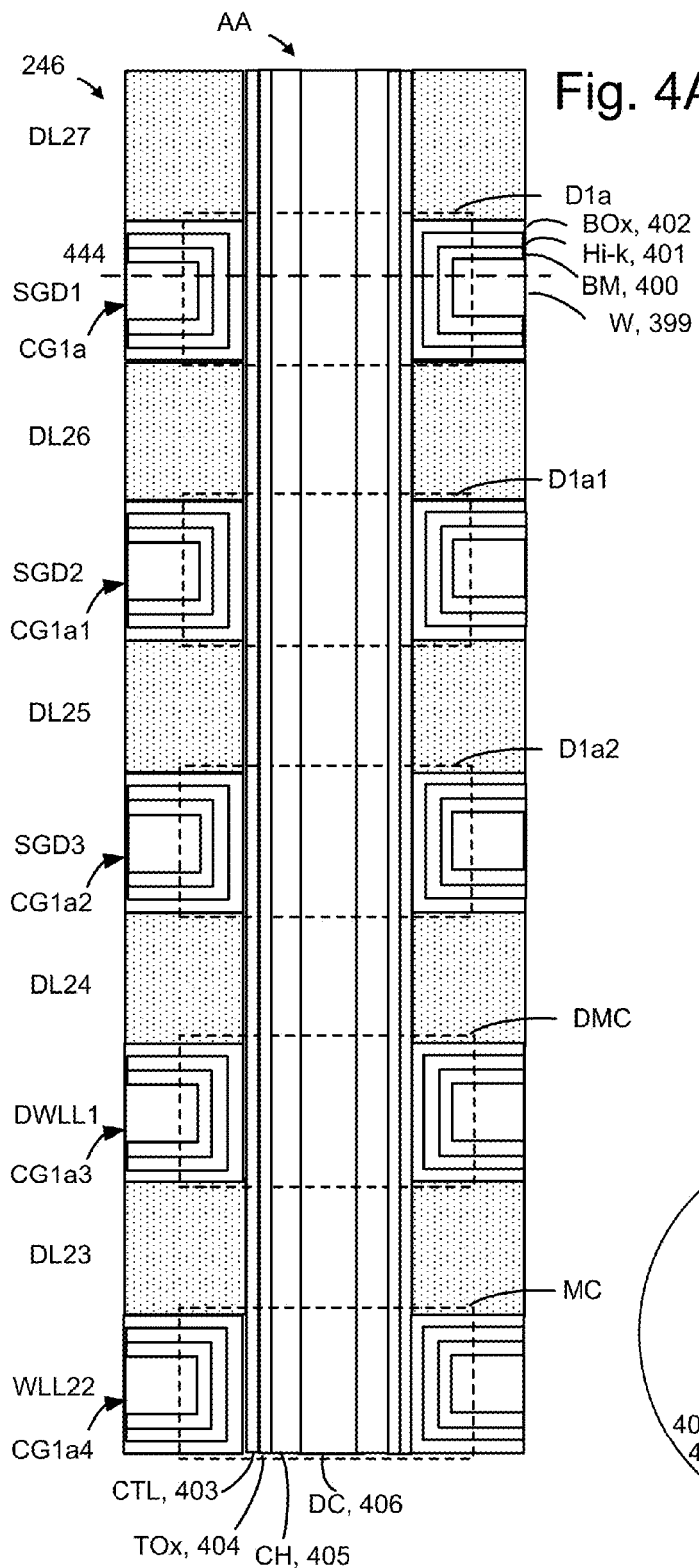
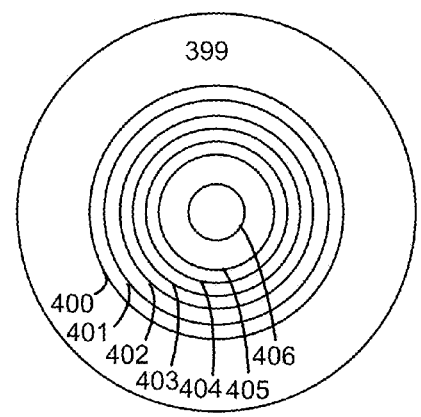

bias drain and source of MC

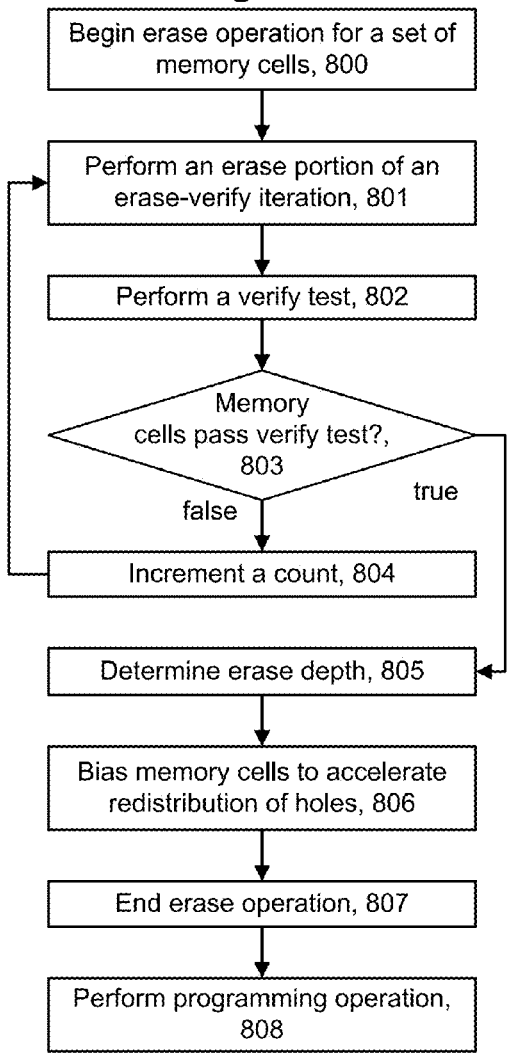
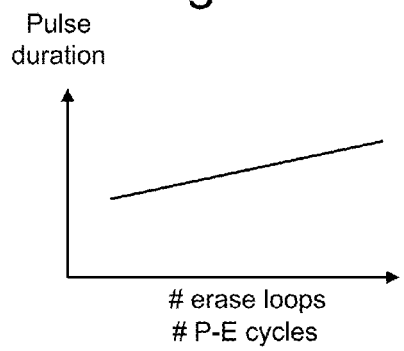
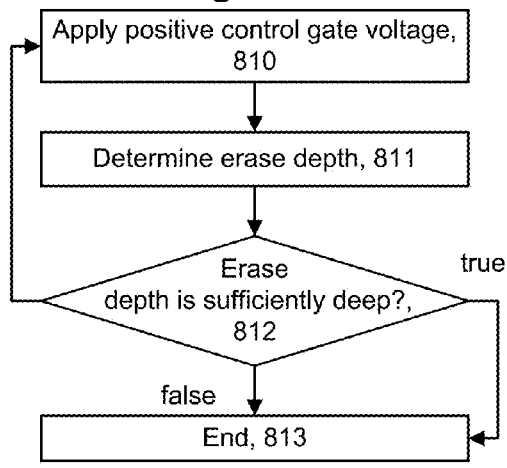
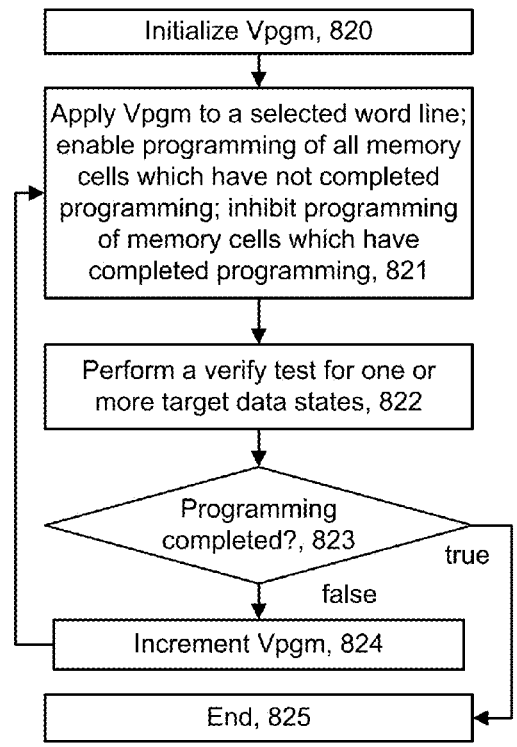

CHARGE REDISTRIBUTION DURING ERASE IN CHARGE TRAPPING MEMORY

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P—BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 2C depicts an embodiment of a stack 231 showing a cross-sectional view of the portion 209 of FIG. 2A, along line 220, where three select gate layers, SGL1, SGL2 and SGL3 are provided.

FIG. 3A depicts a top view of an example word line layer 304 of the block BLK0 of FIG. 1A, in a straight NAND string embodiment.

FIG. 3B depicts a top view of an example SGD layer 362, consistent with FIG. 3A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided.

FIG. 3C2 depicts a variation in the width of a memory hole along its height.

FIG. 4A depicts a view of the region 246 of FIG. 3C1, showing SGD transistors D1a (consistent with FIG. 3C1), D1a1 and D1a2 above a dummy memory cell (DMC) and a data-storing memory cell (MC).

FIG. 4B depicts a cross-section view of the region 246 of FIG. 4A along line 444.

FIG. 8A depicts an example erase operation in which the memory cells are biased to accelerate the redistribution of holes.

FIG. 8B depicts a plot showing an optimal pulse duration versus a number of erase loops or a number of program-erase (P-E) cycles, for use in step 805 of FIG. 8A.

FIG. 8C depicts an example process for implementing step 806 of FIG. 8A using multiple pulses.

FIG. 8D depicts an example programming operation, consistent with step 808 of FIG. 8A.

DETAILED DESCRIPTION

Figure 1A:
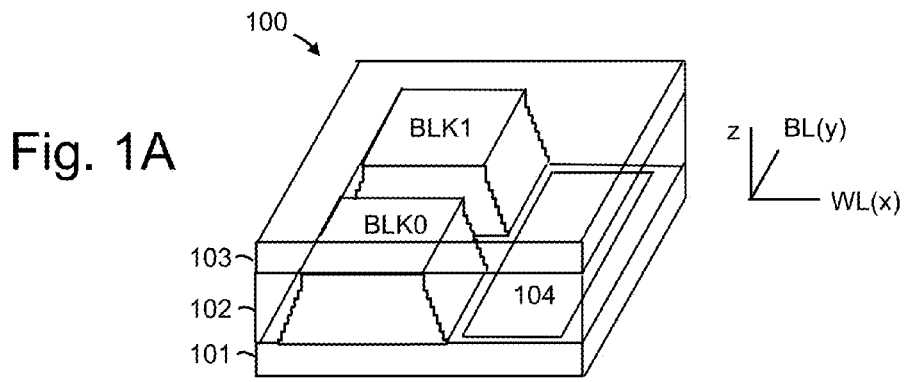
FIG. 1A is a perspective view of a 3D stacked non-volatile memory device.

Techniques are provided for reducing short-term charge loss in charge-trapping memory.

A charge-trapping memory device may use a charge-trapping material such as silicon nitride layer which is arranged between oxide layers (in an oxide-nitride-oxide or ONO configuration) next to a channel region. One example of a charge-trapping memory device is a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string. Some of the conductive layers are used as control gates for memory cells and other conductive layers are used as control gates for select gate transistors, such as drain or source side transistors in NAND strings. Another example of a charge-trapping memory device is a 2D memory device in which the charge-trapping layer extends horizontally along a NAND string.

During programming of a charge-trapping memory cell, electrons move from the channel to the nitride layer. However, a short-term charge loss occurs due to fast charge de-trapping from shallow traps in the ONO layers into the channel. This can occur a few seconds or minutes after a memory cell has completed programming to a target data state according to a verify test. As a result of the charge loss, the threshold voltage (Vth) of the memory cell can decrease to the point where the target data state cannot be accurately read back from the memory cell. Generally, the charge loss causes a set of cells to have a widened Vth distribution which has down-shifted below the verify voltages. This is in conflict with the need to provide narrow Vth distributions to allow multiple data states to be stored.

Short-term charge loss is believed to be caused by holes which are trapped in the upper portion of the charge-trapping material, which is a portion of the charge-trapping material which is furthest from the channel. After programming, the holes are thermally activated to the valence band and diffuse away to the lower portion of the charge-trapping material, which is a portion of the charge-trapping material which is closest to the channel, thereby lowering the Vth. Thus, there is a redistribution of the holes in the charge-trapping material which results in a lowering of the Vth.

Techniques provided herein accelerate the redistribution of the holes in connection with an erase operation, so that there will be a reduced amount of redistribution of the holes after programming. As a result, short-term charge loss after programming is reduced. In one aspect, the techniques include applying a positive control gate voltage to a set of memory cells after a plurality of erase-verify iterations have been performed and before a programming operation begins. The positive control gate voltage has a relatively low amplitude and a long duration, compared to a programming voltage. The positive control gate voltage provides an electron flux in the charge-trapping material which recombines with the holes and mitigates the subsequent hole redistribution in the charge-trapping material after programming. Since the holes are redistributed while the memory cells are in the erased state, the lower tail of the Vth distribution of the erased state will decrease. This is in contrast to soft programming which seeks to narrow the Vth distribution of the erased state by raising the lower tail. The positive control gate voltage should therefore have a magnitude and duration which is sufficiently low to avoid programming of the memory cells above the erased state, and which is sufficiently high to accelerate the redistribution of holes in the charge-trapping material.

In another aspect, the positive control gate voltage is adjusted based on the erase depth of the memory cells. The positive control gate voltage has a duration which is relatively longer when the erase depth is relatively deeper. The erase depth is proportional to how negative the lower tail is in the Vth distribution of the erased state. Generally, the erase depth is deeper when a count of program-erase cycles in the memory device is relatively greater, since the memory cells become easier to erase (and program) as program-erase cycles accumulate. Thus, the positive control gate voltage has a duration which is relatively shorter when a count of program-erase cycles in the memory device is relatively lower.

Moreover, the erase depth is deeper when a count of erase-verify iterations is relatively greater. Thus, the positive control gate voltage has a duration which is relatively shorter when the count is relatively lower.

In another aspect, a position of the lower tail of the Vth distribution is sensed, and the positive control gate voltage is adjusted accordingly. For example, the positive control gate voltage has a duration which is relatively shorter when the position is relatively higher.

In another aspect, a position of the lower tail is sensed after a first positive control gate voltage is applied, and a decision is made to apply a second positive control gate voltage if the lower tail is not sufficiently low.

In another aspect, the positive control gate voltage has a duration which is a function of a height of a selected word line in the memory device. The duration is relatively shorter when the height is associated with a relatively smaller cross-sectional width of a vertical pillar of a memory hole.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
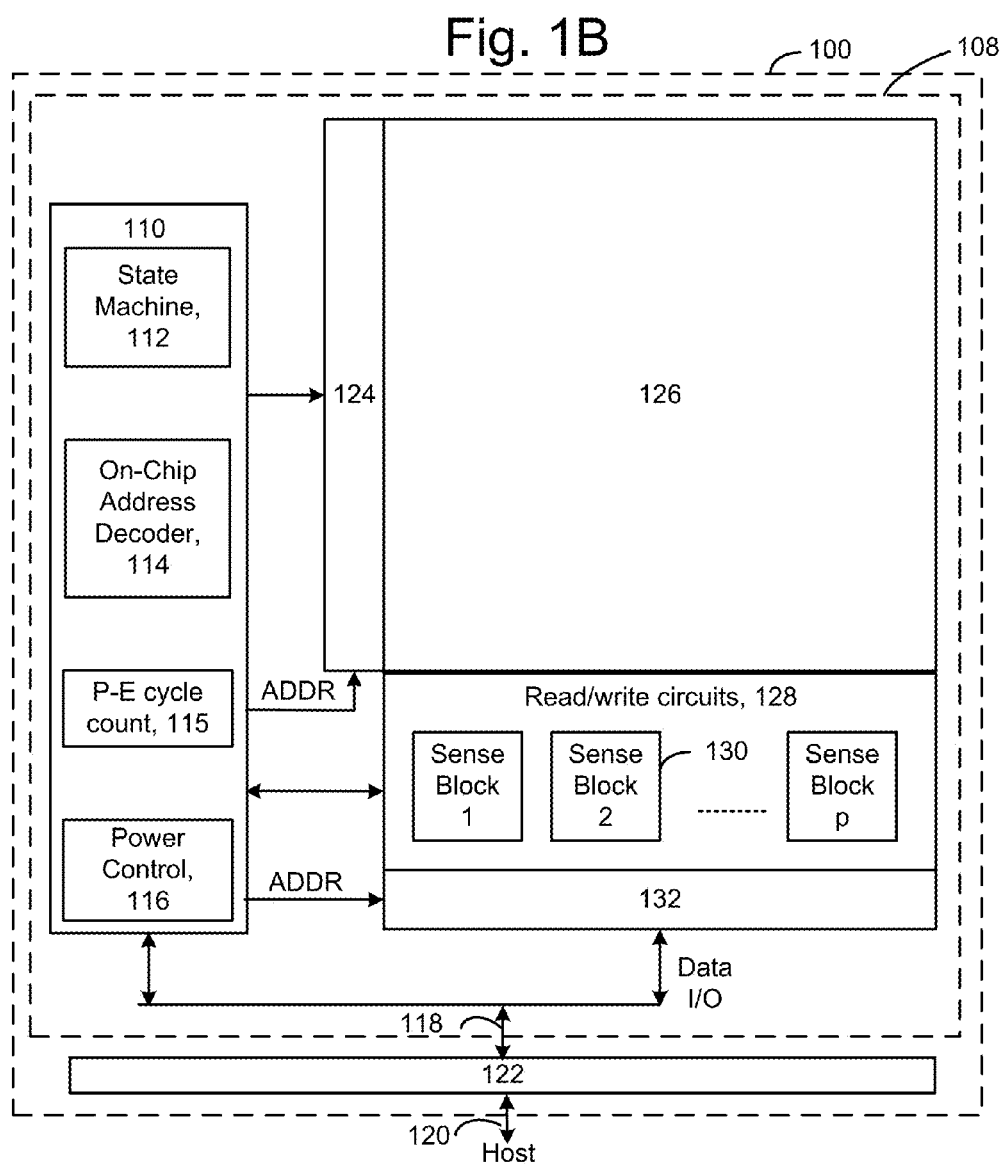
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 115 may be provided for a count of program-erase cycles in the memory device.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figures 2A, 2B:
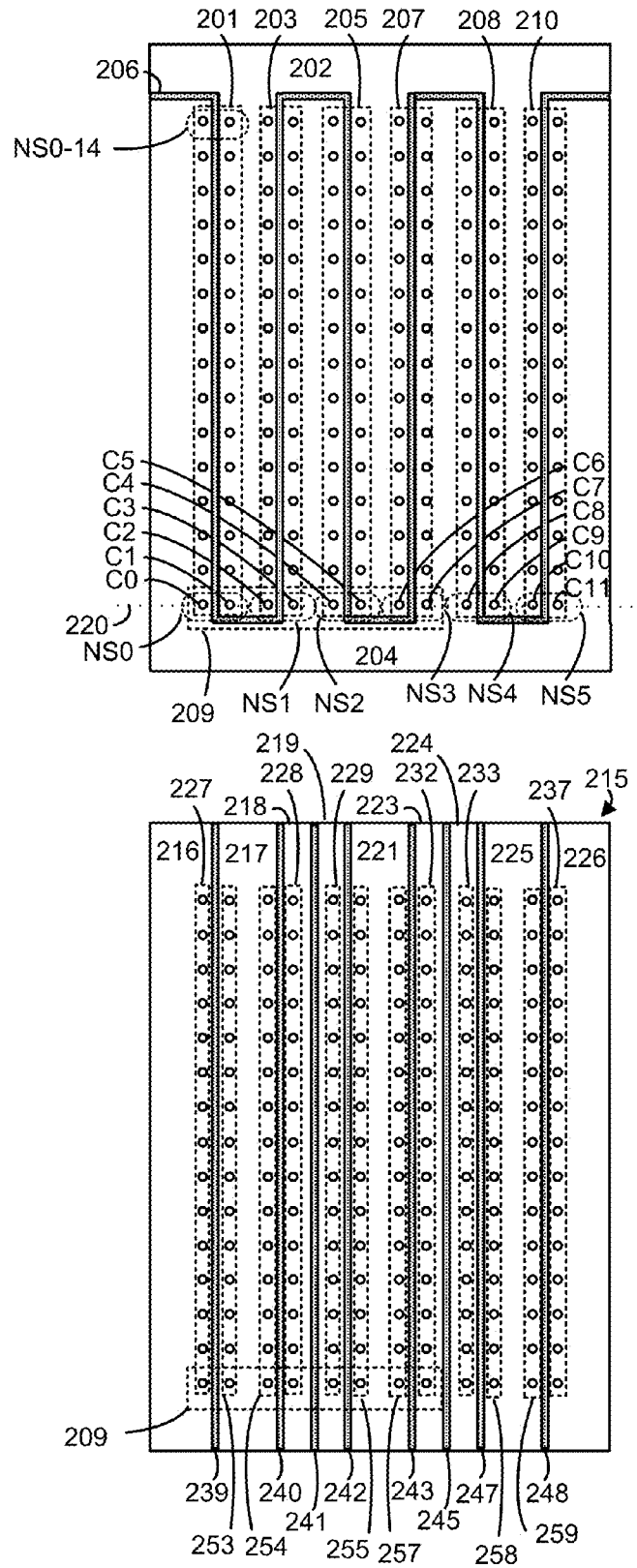
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000× 24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD layer portions 216, 218, 219, 223, 224 and 226, respectively. Regions 253 and 254, 255 and 257, and 258 and 259 represent SGS transistors in SGS layer portions 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

A region 246 of the stack is shown in greater detail in FIG. 4A.

Figure 4C:
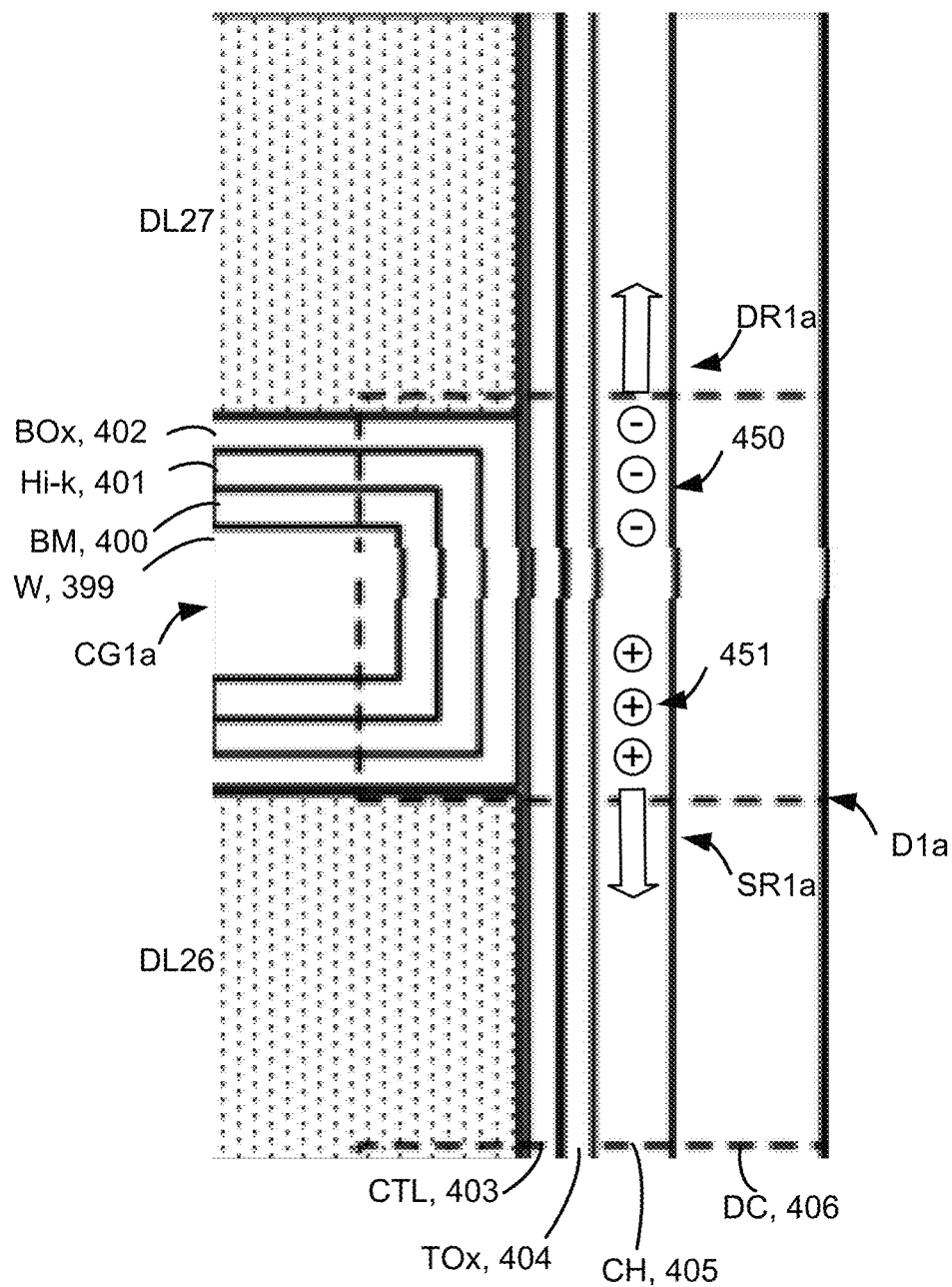
FIG. 4C depicts an expanded view of a portion of the SGD transistor D1a of FIG. 4A.
Figure 4D:
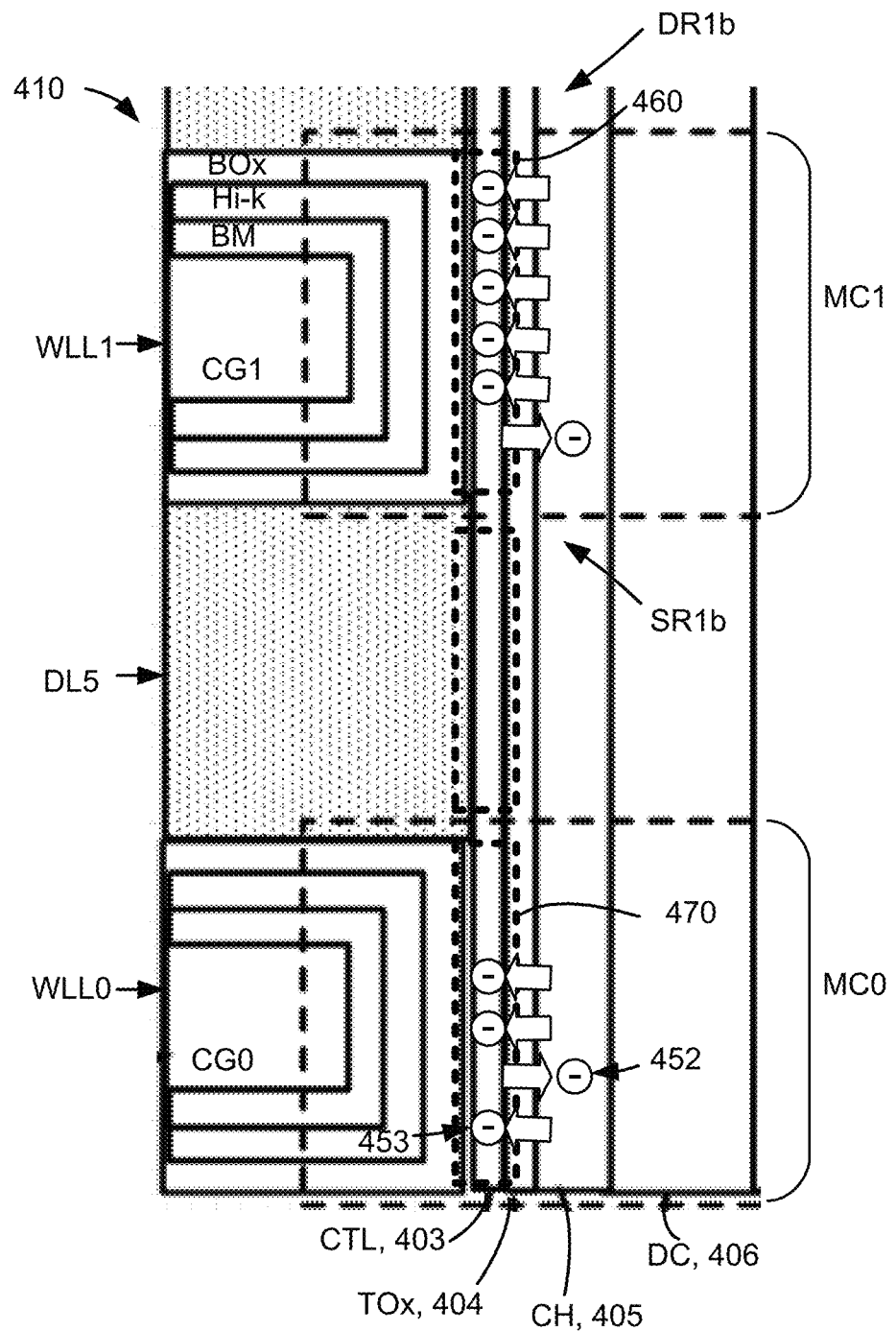
FIG. 4D depicts an expanded view of a region 410 of the NAND string of FIG. 3C2.

A region 410 of the stack is shown in greater detail in FIG. 4D.

Regions D1a, D2a, D3a and D4a represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunnel oxide is stronger, so that the programming and erase speed is higher.

FIG. 4A depicts a view of the region 246 of FIG. 3C1, showing SGD transistors D1a, D1a1 and D1a2 above a dummy memory cell (DMC) and a data-storing memory cell (MC). A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunnel oxide (TOx) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a, D1a1 and D1a2, the dummy memory cell DMC and the memory cell MC, respectively. In another approach, all of these layers except the metal are provided in the column. Additional memory cells are similarly formed throughout the columns. The layers in the memory hole form a columnar active area (AA) of the NAND string.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string. In particular, to provide the select gate transistors in a non-conductive state, a relatively low voltage is applied to their control gates, resulting in a relatively lower amount of channel boosting in a region of the channel next to these select gate transistors. A region of the channel next to an edge cell will therefore also have a relatively lower amount of channel boosting. In contrast, the cells next to a non-edge cell can receive a relatively high pass voltage since these cells are provided in a conductive state, resulting in a relatively higher amount of channel boosting.

When a memory cell is programmed, electrons are stored in a portion of the CTL which is associated with the memory cell. These electrons are drawn into the CTL from the channel, and through the TOx. The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B depicts a cross-section view of the region 246 of FIG. 4A along line 444. Each layer is ring-shaped in one possible approach, except the core filler, which is a cylinder.

FIG. 4C depicts an expanded view of a portion of the SGD transistor D1a of FIG. 4A. An erase operation can involve charging up a channel of the NAND string while floating the voltages of the control gates of the memory cells. This allows the voltages of the control gates of the memory cells to increase with the voltage of the channel due to coupling. The voltages of the control gates of the memory cells are then driven lower, such as to ground or a negative voltage, generating an electric field which drives electrons out of a charge-trapping layer and into the channel, lowering the threshold voltages of the memory cells. This process can be repeated in multiple erase-verify iterations until the threshold voltages of the memory cells are below a desired erase verify level, e.g., Vv_erase.

The charging up of the channel occurs due to gate-induced drain leakage (GIDL) of the select gate transistors at the drain and/or source ends of the NAND string. The select gate transistors are reversed biased, e.g., with a positive drain-to-gate voltage, which results in the generation of electron-hole pairs. For example, at the drain end of a NAND string, a bit line voltage (erase pulse) is applied which exceeds a voltage at the control gate of a drain-side select gate transistor by a few Volts. Similarly, at the source end of a NAND string, a source line voltage is applied which exceeds a voltage at the control gate of a source-side select gate transistor. The electrons are swept away by the electrical field and collected at the bit line and/or source line terminals; while holes will drift to the channel and help to charge up the channel. That is, the electrons will drift toward the high voltage of the bit line or source line, while the holes will drift toward a low voltage.

GIDL results in the generation of electron-hole pairs, including example electrons 450 and holes 451. As indicated by the arrows, the electrons are attracted to the high erase voltage at the drain or source end of the NAND string while the holes are attracted to a lower voltage region of the channel. When multiple select gate transistors are used at one end of a NAND string, each select gate transistor can generate a similar amount of GIDL. Additionally, one or more dummy memory cells can receive a bias which is similar to the bias of the select gate transistor and generate GIDL. A one-sided or two-sided erase may be used. In a one sided erase, one or more select gate transistors at the drain end of the NAND string, and optionally, one or more dummy memory cells at the drain end, are biased to generate GIDL. A two-sided erase augments the GIDL generated at the drain end by also biasing one or more select gate transistors at the source end of the NAND string, and optionally, one or more dummy memory cells at the source end, to generate GIDL. The SGD transistor D1a has a source side SR1a and a drain side DR1a.

The dummy memory cells and the select gate transistors have a threshold voltage which is kept within a fixed range.

FIG. 4D depicts an expanded view of a region 410 of the NAND string of FIG. 3C2. When a program voltage is applied to the control gate of a memory cell via a respective word line, an electric field is generated. In MC0, the electric field causes electrons to tunnel into a region 470 of the charge-trapping layer 403, from the channel 405. Similarly, for MC1, the electric field causes electrons to tunnel into a region 460 of the charge-trapping layer 403, from the channel 405. The movement of the electrons into the charge-trapping layer is represented by the arrows which point to the left. The electrons are represented by circles with a dash inside the circle.

When a memory cell on a selected word line is subsequently read back, control gate read voltages such as VreadA, VreadB and VreadC are applied to the memory cell while sensing circuitry determines whether the memory cell is in a conductive state. At the same time, a read pass voltage, Vread (e.g., 8-9 V), is applied to the remaining word lines.

However, as mentioned at the outset, the accuracy of the read back operation can be impaired by charge loss in the memory cells. Charge loss is represented by the arrows which point to the right. For example, an electron 452 is an example of a charge which has de-trapped from the charge-trapping region 470, lowering the Vth of MC0. An electron 453 is an example of a charge which remains in the charge-trapping region 470.

MC1 has a drain DR1b, a source SR1b and a control gate CG1.

Figure 5A:
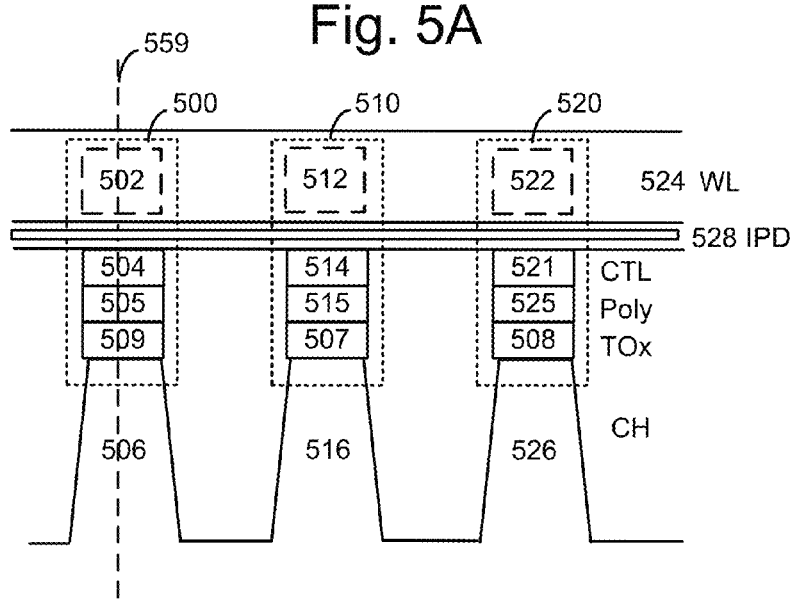
FIG. 5A depicts a cross-sectional view in a word line direction of memory cells comprising a flat control gate and charge-trapping regions as a 2D example of memory cells in the memory structure 126 of FIG. 1B.

FIG. 5A depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel oxide (TOx) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

Figure 5B:
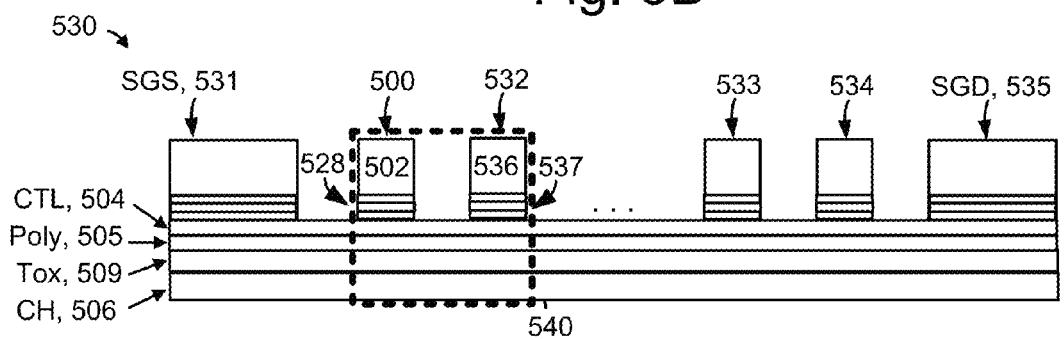
FIG. 5B depicts a cross sectional view along line 559 in FIG. 5A, showing a NAND string 530 having a flat control gate and a charge-trapping layer.

FIG. 5B depicts a cross sectional view along line 559 in FIG. 5A, showing a NAND string 530 having a flat control gate and a charge-trapping layer. The NAND string 530 includes an SGS transistor 531, example storage elements 500, 532, . . . , 533 and 534, and an SGD transistor 535. The SGD transistor can be biased to produce GIDL during an erase operation, as discussed. The memory cell 500 includes the control gate 502 and an IPD portion 528 above the charge-trapping layer 504, the polysilicon layer 505, the tunnel oxide layer 509 and the channel region 506. The memory cell 532 includes a control gate 536 and an IPD portion 537 above the charge-trapping layer 504, the polysilicon layer 505, the tunnel oxide layer 509 and the channel region 506.

The control gate layer may be polysilicon and the tunnel oxide layer may be silicon oxide, for instance. The IPD layer can be a stack of high-k dielectrics such as AlOx or HfOx which help increase the coupling ratio between the control gate layer and the charge-trapping or charge storing layer. The charge-trap layer can be a mix of silicon nitride and oxide, for instance. A difference between a floating gate memory cell and the flat memory cell is the height of the charge storage layer. A typically floating gate height may be about 100 nm, while a charge-trap layer can be as small as 3 nm, and the polysilicon layer can be about 5 nm. The SGD and SGS transistors have the same configuration as the storage elements but with a longer channel length to ensure that current is cutoff in an inhibited NAND string.

Figure 5C:
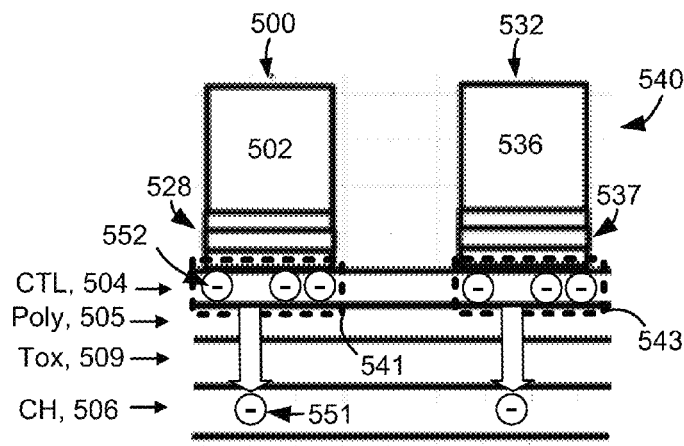
FIG. 5C depicts an expanded view of a portion 540 of the NAND string of FIG. 5B.

FIG. 5C depicts an expanded view of a portion 540 of the NAND string of FIG. 5B. The charge-trapping layer 504 includes regions 541 and 543 which are directly under and adjacent to the memory cells 500 and 532, respectively.

Charge loss can occur in a 2D memory device in a similar way as in the 3D memory device. Charge loss is represented by the arrows which point downward. For example, an electron 551 is an example of a charge which has de-trapped from the charge-trapping region 541, lowering the Vth of the memory cell 500. An electron 552 is an example of a charge which remains in the charge-trapping region 541.

Figure 6A:
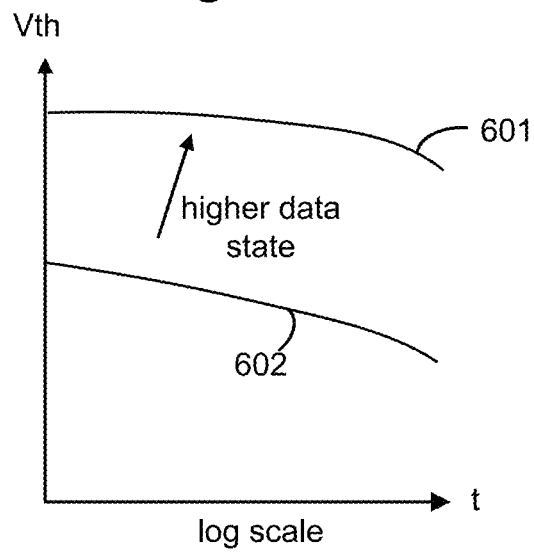
FIG. 6A is a plot of Vth versus time, showing a decrease in Vth after a memory cell is programmed due to short-term charge loss.

FIG. 6A is a plot of Vth versus time, showing a decrease in Vth after a memory cell is programmed due to short-term charge loss. The horizontal axis depicts time on a logarithmic scale and the vertical axis depicts the Vth of a memory cell. After the memory cell is programmed to an initial Vth of its target data state, its Vth gradually decreases. The rate of decrease is a function of the data state, such that the rate is smaller when the Vth of the data state is higher. This is because the memory cells with the higher data states receive a larger number of program pulses before they complete programming, compared to memory cells with the lower data states. The additional program pulses accelerate hole redistribution in the charge-trapping material before the memory cells with the higher data states have completed programming. Further, relatively high magnitude program pulses are used which stress the gate stacks of the memory cells with the higher data states, also accelerating hole redistribution.

Figure 6B:
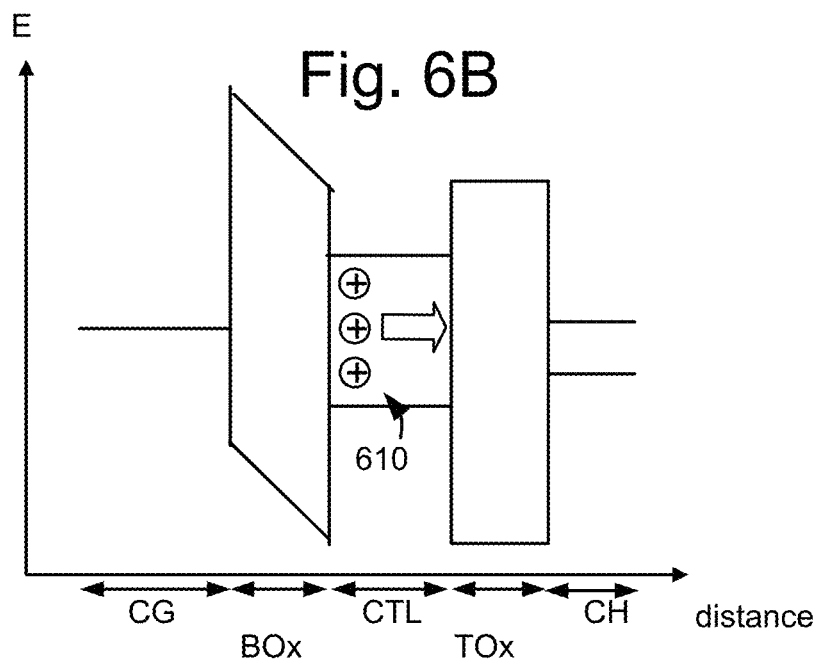
FIG. 6B depicts an energy band diagram for a charge-trapping memory cell.

FIG. 6B depicts an energy band diagram for a memory cell. The horizontal axis depicts a distance in the memory cell. For example, this can be a lateral distance in a 3D memory device or a vertical distance in a 2D memory device. The vertical axis depicts an energy level. The memory cell includes a channel region (CH), a tunnel oxide region (TOx), a charge-trapping layer (CTL), a block oxide (BOx) and a control gate (CG). Example holes 610 in the CTL are also depicted. This is a band diagram at a flatband condition after erase, and represents how the holes are redistributed in the CTL due to the use of a positive control gate voltage after erase, as described herein. By causing the redistribution before programming, the redistribution which occurs after the cell is programmed so that changes in the Vth of the cell are reduced.

Figure 7A:
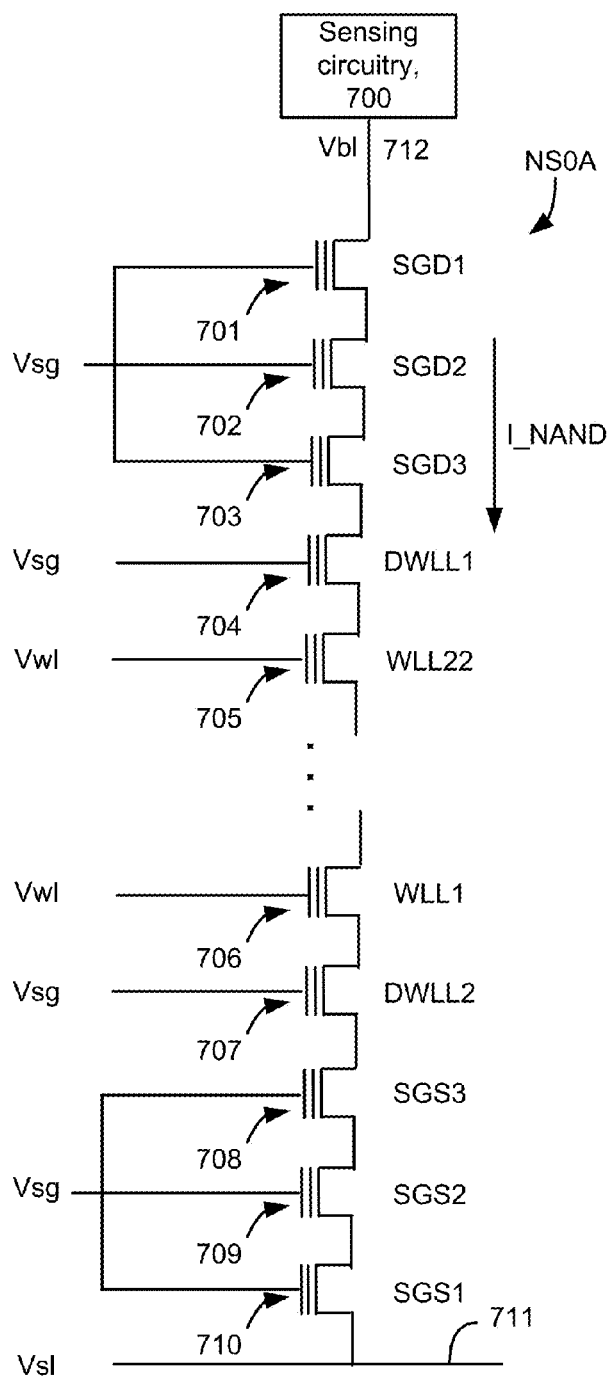
FIG. 7A depicts a circuit diagram of a NAND string consistent with the memory devices of FIGS. 2C and 3C1.

FIG. 7A depicts a circuit diagram of a NAND string consistent with the memory devices of FIGS. 2C and 3C1. An example NAND string NS0A, consistent with FIG. 3C1 (or NS0 consistent with FIG. 2C), includes SGD transistors 701, 702 and 703, a drain-side dummy memory cell 704, data-storing memory cells 705, . . . , 706, a source-side dummy memory cell 707, and SGS transistors 708, 709 and 710. A bit line 712 connects the drain end of the NAND string to sensing circuitry 700, which is used to sense the NAND string during operations involving the select gate transistors and the memory cells. A source line 711 is connected to a source end of the NAND string. Voltage drivers can be used to provide the voltages depicted. For example, Vsg is applied to the control gates of the SGD transistors, which are connected to one another and to the control gates of the SGS transistors, which are connected to one another. Vsg can also be applied to the dummy memory cells 704 and 707. A common word line voltage Vwl is applied to each of the data-storing memory cells, in this example. Vbl is the bit line voltage and Vsl is the source line voltage. I_NAND is a sensed current in the NAND string.

Figure 7B:
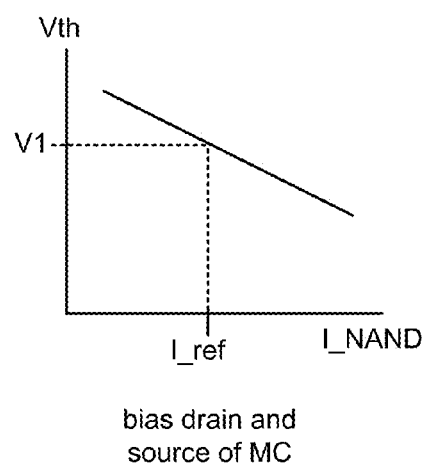
FIG. 7B depicts a plot of Vth versus I_NAND, a current in a NAND string during a sensing operation.

FIG. 7B depicts a plot of Vth versus I_NAND, a current in a NAND string during a sensing operation. An erase operation can include a number of erase-verify iterations which are performed until the erase operation is completed. An erase-verify iteration includes an erase portion in which an erase voltage is applied, followed by a verify test. While it possible to verify memory cells in one or more selected word lines, typically an entire block is erased, in which case the verification can be performed concurrently for all memory cells in one or more NAND strings. During a verify operation for the memory cells of a NAND string, a verify voltage (Vv_erase) is applied to the control gates of the memory cells while a bit line voltage is supplied using sensing circuitry. The select gate transistors and dummy memory cells are provided in a conductive state and act as pass gates. A current in the NAND string is detected and compared to a reference current, e.g., using a current comparison circuit. If the current in the NAND string exceeds the reference current, this indicates the cells in the NAND string are in a conductive state, so that their Vth is below Vv_erase. That is, all of the cells in the NAND string are erased and the NAND string passes the verify test. On the other hand, if the current in the NAND string does not exceed the reference current, this indicates the cells in the NAND string are in a non-conductive state, so that their Vth is above Vv_erase. That is, not all of the cells in the NAND string are erased and the NAND string does not pass the verify test.

In one approach, the memory device has the capability to apply Vv_erase as a negative voltage on the word lines, such as by using a negative charge pump. In this case, the drain (bit line) and source can be set at 0 V, and there is a positive source-to-control gate voltage of the memory cells. For example, with Vv_erase=–2 V and Vsource=0 V, Vsource–Vv_erase=0–(–2)=2 V. In other cases, it may be desired to apply a zero or positive control gate voltage during sensing. To do this, Vsource can be elevated so that there is still a positive source-to-control gate voltage. For example, with Vv_erase=0 V and Vsource=2 V, Vsource–Vv_erase=2–(0)=2 V, as before. The same Vth in a memory cell can therefore be sensed without using a negative control gate voltage.

For a set of NAND strings, the erase operation can be considered to be completed when all, or at least a specified majority, of the NAND strings pass the verify test. If the erase operation is not completed after an erase-verify iteration, another erase-verify iteration can be performed using a stronger erase voltage.

FIG. 8A depicts an example erase operation in which the memory cells are biased to accelerate the redistribution of holes. Step 800 begins an erase operation for a set of memory cells such as in a block. Step 801 involves performing an erase portion of an erase-verify iteration. See also FIG. 9A. Step 802 involves performing a verify test. See also FIG. 7B. Decision step 803 determines whether the memory cells pass the verify test. If decision step 803 is false, a count of erase-verify iterations is incremented at step 804 and the erase portion of a next erase-verify iteration is performed at step 801. If decision step 803 is true, step 805 determines an erase depth. See also FIG. 10D. Step 806 biases the memory cells to accelerate the redistribution of holes, e.g., by applying a positive control gate voltage. See also FIG. 8C. In one approach, a common positive control gate voltage is applied concurrently to each memory cell in a set of memory cells via the respective word lines.

In another approach, the vertical pillars of the NAND strings have varying cross-sectional widths along a height of a three-dimensional memory structure, the positive control gate voltage has a duration which is a function of a height of a selected word line in the memory device, and the duration is relatively shorter when the height is associated with a relatively smaller cross-sectional width of the vertical pillars.

Step 807 ends the erase operation. Step 808 involves performing a programming operation.

Typically, an erase operation is performed in connection with a subsequent programming operation. Thus, the biasing of the memory cells to accelerate the redistribution of holes can be performed in response to one or more commands from a state machine or other control circuit which involve an erase and programming. In another approach, the biasing of the memory cells to accelerate the redistribution of holes can be performed in response to one or more commands which involve an erase. In another approach, the biasing of the memory cells to accelerate the redistribution of holes can be performed in response to one or more commands which involve programming.

FIG. 8B depicts a plot showing an optimal pulse duration (vertical axis) versus a number of erase loops or a number of program-erase (P-E) cycles (horizontal axis), for use in step 805 of FIG. 8A. A relatively high number of program-erase cycles generally results in a deeper erase depth because the memory cells can take larger Vth jumps with each erase-verify iteration. Further, a deeper erase results in relatively more holes being injected into the charge-trapping material. As a result, a longer pulse duration is appropriate for the positive control gate voltage in proportion to the number of program-erase cycles. The magnitude of the positive control gate voltage could be increased as well, but an increase in the duration is more likely to avoid undesired any chance of programming the cells. Similarly, a relatively high number of erase loops (e.g., erase-verify iterations) generally results in a deeper erase depth. As a result, a longer pulse duration is appropriate for the positive control gate voltage in proportion to the number of erase loops.

FIG. 8C depicts an example process for implementing step 806 of FIG. 8A using multiple pulses. Step 810 applies a positive control gate voltage to the memory cells. Step 811 determines an erase depth. See also FIG. 10E. Decision step 812 determines whether the erase depth is sufficiently deep. If decision step 812 is false, step 810 is performed again to apply another positive control gate voltage. This additional positive control gate voltage can have the same duration and magnitude as the initial positive control gate voltage. Or, the duration and/or magnitude can be different. If decision step 812 is true, the process ends at step 813.

FIG. 8D depicts an example programming operation, consistent with step 808 of FIG. 8A. The programming may comprise incremental step pulse programming (ISPP). Step 820 involves initializing Vpgm, the program voltage. Step 821 involves applying Vpgm to a selected word line, while enabling programming of all memory cells which have not completed programming (such as by grounding bit lines which are connected to NAND strings in which these cells are located), and inhibiting programming of memory cells which have completed programming (such as by raising voltages of bit lines which are connected to NAND strings in which these cells are located).

Figure 10A:
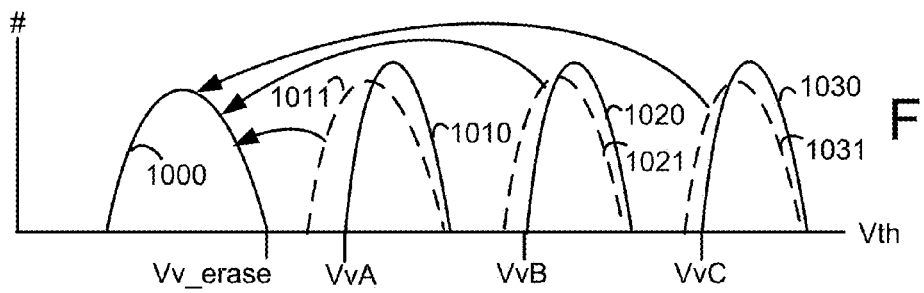
FIG. 10A depicts Vth distributions of a set of memory cells, showing a decrease in Vth due to charge loss, and a subsequent erase operation, consistent with steps 801 and 802 of FIG. 8A.

Step 822 involves performing a verify test for memory cells with one or more target data states using verify voltages (e.g., VvA, VvB or VvC; see FIG. 10A). Decision step 823 determines if programming of the set of memory cells is completed. This is true when all, or almost all, of the memory cells have passed their respective verify test. If decision step 823 is false, Vpgm is incremented at step 824 and step 821 is repeated in a next program-verify iteration. If decision step 823 is true, the programming ends at step 825.

Figure 9A:
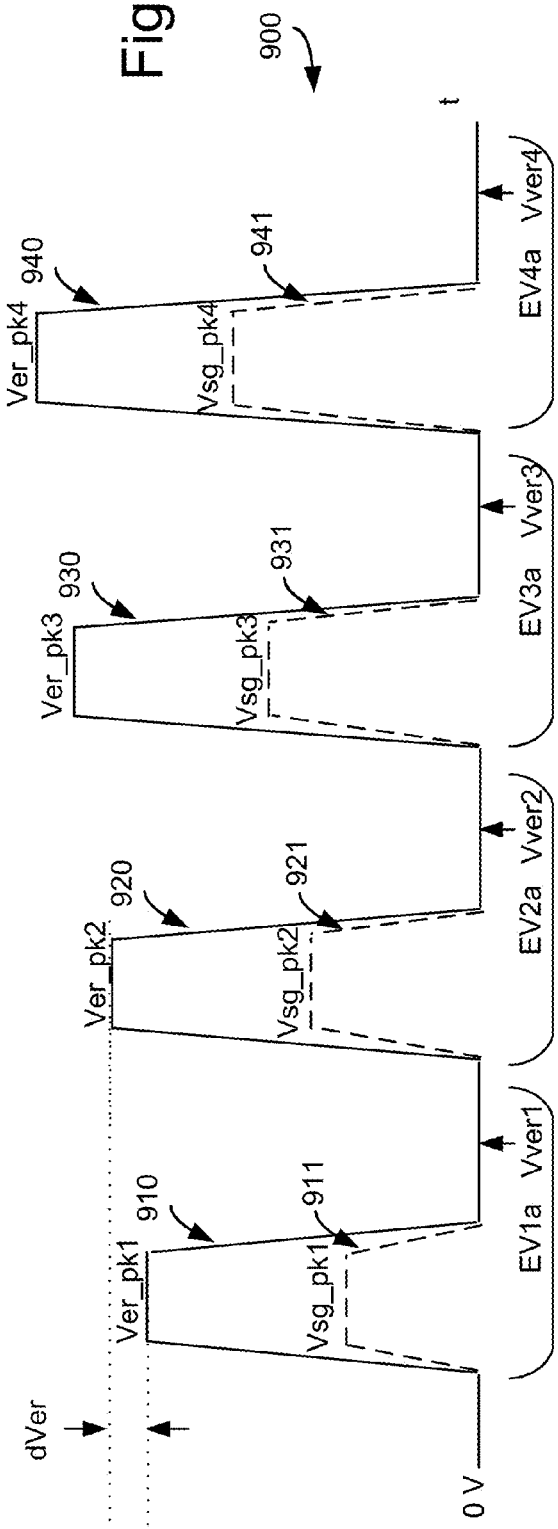
FIG. 9A depicts an example erase waveform 900 for use in step 801 of FIG. 8A.

FIG. 9A depicts an example erase waveform 900 for use in step 801 of FIG. 8A. The erase operation comprises a series of program-erase iterations EV1, EV2, EV3 and EV4. Four erase-verify iterations are shown as an example. One or more can be used. In the first erase-verify iteration EV1, an erase voltage waveform 910 is applied to a bit line and/or source line of each selected NAND string (e.g., each NAND string which has one or more memory cells to be erased), and a select gate waveform 911 is applied to the select gate transistors. The erase voltage waveform 910 has a peak level of Ver_pk1. The select gate waveform 911 has a peak level of Vsg_pk1. A step size for the erase voltage waveform is dVer.

In the second erase-verify iteration EV2, an erase voltage waveform 920 has a peak level of Ver_pk2. The select gate waveform 921 has a peak level of Vsg_pk2.

In the third erase-verify iteration EV3, an erase voltage waveform 930 has a peak level of Ver_pk3. The select gate waveform 931 has a peak level of Vsg_pk3.

In the fourth erase-verify iteration EV4, an erase voltage waveform 940 has a peak level of Ver_pk4. The select gate waveform 941 has a peak level of Vsg_pk4.

Further, verify operations Vver1, Vver2, Vver3 and Vver4 are performed in the erase-verify iterations EV1, EV2, EV3 and EV4, respectively.

In this example, the peak levels of the select gate voltage and the erase voltage are stepped up together so that there is a fixed difference between them. This provides a consistent drain-to-gate voltage which results in a consistent amount of GIDL and charge up of the channel. However, other approaches are possible. For example, the peak level of the select gate voltage may be fixed. In another option, the erase voltage steps up to its peak in two steps instead of one to allow time for the charge up of the channel to occur. In another option, the erase voltage and the select gate voltage both step up to their peaks in two steps.

Any unselected NAND strings can be inhibited from being erased by allowing the voltages of the select gate transistors to float, for instance, so that their channels are not charged up.

Note that while two-step waveforms are provided, other variations are possible. For example, generally, a multi-step waveform comprising two or more steps can be used. In another variation, the waveforms comprise ramps instead of, or in addition to, steps.

Figure 9B:
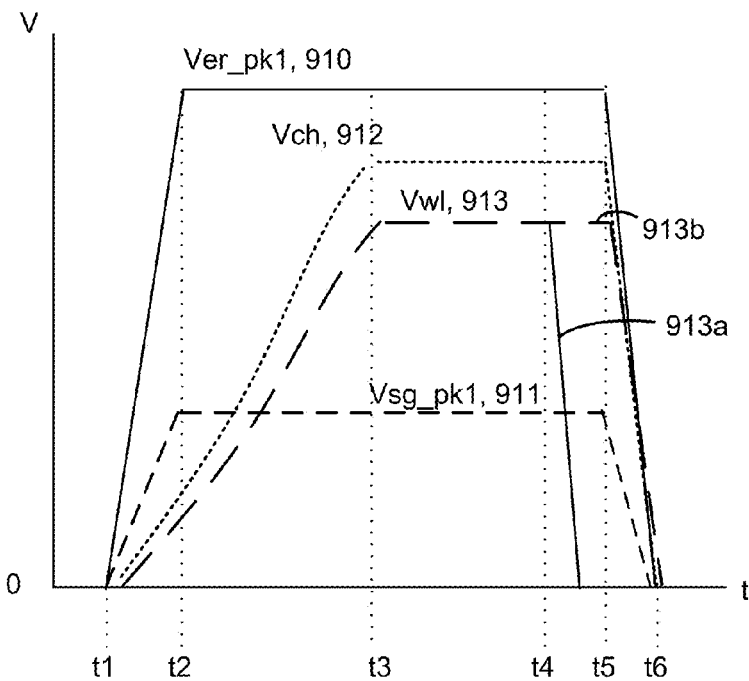
FIG. 9B depicts a detailed view of the waveforms 910 and 911 of FIG. 9A in addition to a waveform 912 which represents a voltage of a channel of a NAND string, and a waveform 913 which represents a voltage of a control gate of a memory cell.

FIG. 9B depicts a detailed view of the waveforms 910 and 911 of FIG. 9A in addition to a waveform 912 which represents a voltage of a channel (Vch) of a NAND string, and a waveform 913 which represents a voltage of a control gate of a memory cell or an associated word line (Vwl). The horizontal axis depicts time and the vertical axis depicts voltage. Before t1, the waveforms are at 0 V. From t1-t2, the erase voltage waveform is increased to a peak level, Ver_pk1, and the select gate waveform is increased to a peak level, Vsg_pk1. At this time, GIDL begins to occur in proportion to the drain-to-gate voltage (Ver_pk1–Vsg_pk1) of the select gate transistors. Between t2 and t3, the channel continues to charge up, and remains at a peak charged level from t3-t4. Vwl (waveform 913) is floating so that it is coupled up by Vch to a level which is slightly below Vch.

For the selected word lines, waveform portion 913a indicates that the word line voltage is driven lower, e.g., to 0 V, driving electrons out of the charge trapping layer and into the channel, thus erasing the associated memory cells. For the unselected word lines, if any, waveform portion 913b indicates that the word line voltage remains floating so that no erasing occurs for the associated memory cells. Between t5 and t6, the select gate waveform and the erase voltage waveform are reduced to 0 V. Vch and Vwl follow to 0 V.

Figure 9C:
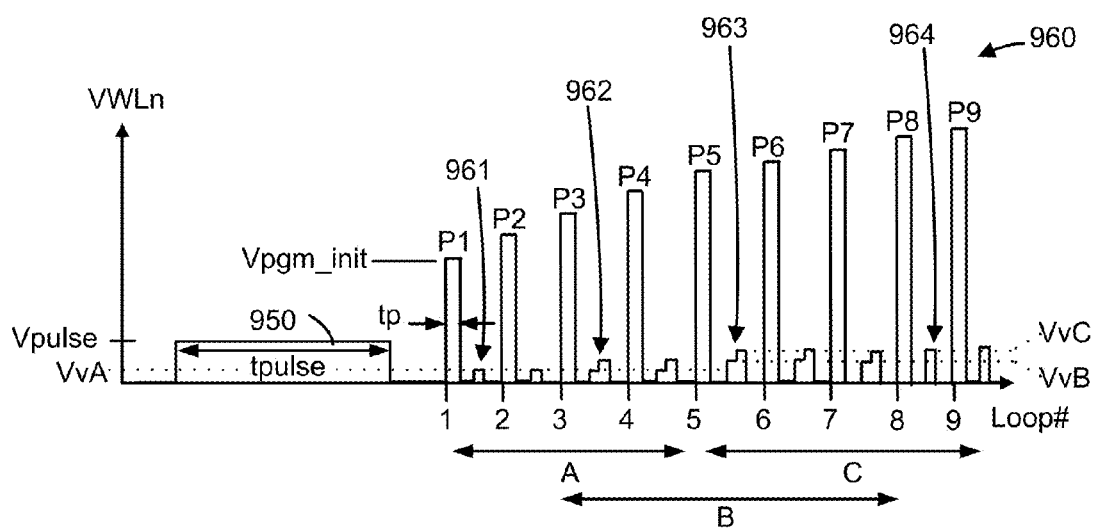
FIG. 9C depicts voltages applied to a word line in a programming operation, consistent with step 808 of FIG. 8A.

FIG. 9C depicts voltages applied to a word line in a programming operation, consistent with step 808 of FIG. 8A. The horizontal axis depicts time or program loops and the vertical axis depicts VWLn, the voltage on an nth word line which is selected for programming. The programming pass comprises a series of waveforms 960. ISPP is performed for each target data state. This example also performs verify tests based on the program loop. For example, the A, B and C state cells are verified in loops 1-4, 3-7 and 5-9, respectively. An example verify waveform 961 comprises an A state verify voltage at VvA. An example verify waveform 962 comprises A and B state verify voltages at VvA and VvB, respectively. An example verify waveform 963 comprises B and C state verify voltages at VvB and VvC, respectively. An example verify waveform 964 comprises a C state verify voltage at VvC. The program pulses P1 (with amplitude Vpgm_init and duration tp), P2, P3, P4, P5, P6, P7, P8 and P9 are also depicted.

The positive control gate voltage 950 with a duration of tpulse and an amplitude of Vpulse is also depicted. Recall that this voltage can be applied in connection with an erase operation which precedes the programming operation.

Generally, the positive control gate voltage can be adjusted in magnitude and duration to optimize the amount of hole redistribution. The positive control gate voltage should result in lowering of the lower tail of the Vth distribution of the erased state without raising the upper tail. However, in some cases, some raising of the upper tail may be acceptable. The raising of the upper tail reduces the space between the Vth distributions of the erased state and the A state, which in turn lowers the Vth window.

As an example, the magnitude can be 5 V and the duration can be 1 milliseconds for a fresh memory device and 2 milliseconds for a cycled memory device. In one approach, the positive control gate voltage has a magnitude which is less than one half or one third of an initial program voltage (Vpgm_int, e.g., 15-18 V) of the incremental step pulse programming and has a duration which is at least five, ten or twenty times longer than a duration of the initial program voltage (e.g., 10-40 microseconds).

Additionally, when the positive control gate voltage is applied to a memory cell, the drain of each memory cell can be set by a voltage of a bit line connected to a NAND string in which the memory cell is located. If the bit line is grounded, the gate-to-drain voltage is equal to the positive control gate voltage. The applying of a positive control gate voltage can therefore be considered to be the same as applying a positive control gate-to-drain voltage.

Moreover, the memory cells of a set of memory cells may be arranged in a set of NAND strings, where each NAND string of the set of NAND strings is connected to a bit line in a set of bit lines. The providing of the positive control gate-to-drain voltage for each memory cell in the set of memory cells can comprise setting each bit line in the set of bit lines to a fixed level (e.g., 0 V) which is less than the positive control gate voltage.

FIG. 10A depicts Vth distributions of a set of memory cells, showing a decrease in Vth due to charge loss, and a subsequent erase operation, consistent with steps 801 and 802 of FIG. 8A. In FIG. 10A to 10F, the horizontal axis depicts Vth and the vertical axis depicts a number of memory cell, on a logarithmic scale. A set of memory cells is initially programmed from an erased state to target data states of A, B and C using verify voltages of VvA, VvB and VvC, respectively, in a four state memory device. In other cases, eight, sixteen or more data states are used. The erased state and the A, B and C states are represented by Vth distributions 1000, 1010, 1020 and 1030, respectively. After programming, short-term charge loss occurs due to the redistribution of holes in the charge-trapping material of the memory cells, so that the Vth distributions 1010, 1020 and 1030 shift down and widen to become the Vth distributions 1011, 1021 and 1031, respectively. The memory cells are subsequently erased using the verify voltage of Vv_erase.

Figure 10B:
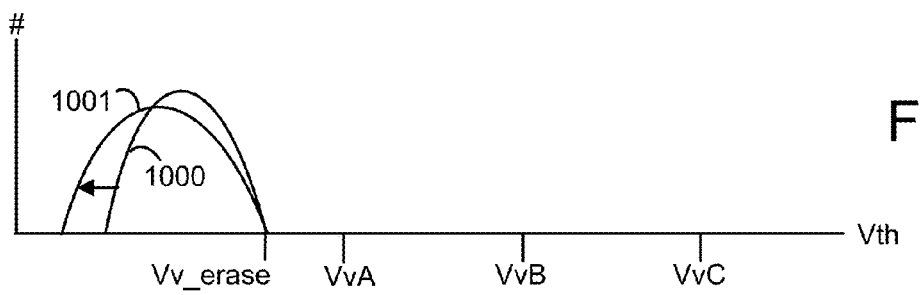
FIG. 10B depicts a decrease in the lower tail of the Vth distribution of the erased state due to biasing of memory cells to accelerate redistribution of holes, consistent with step 806 of FIG. 8A.

FIG. 10B depicts a decrease in the lower tail of the Vth distribution of the erased state due to biasing of memory cells to accelerate redistribution of holes, consistent with step 806 of FIG. 8A. In this case, the Vth distribution 1000 becomes wider due to the lower tail of the Vth distribution becoming lower, resulting in the Vth distribution 1001. This result is contrasted with soft programming in which the lower tail become higher. In one approach, soft programming is not used.

Figure 10C:
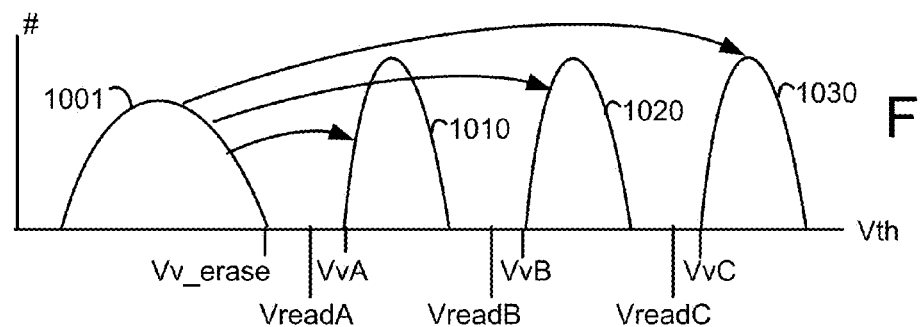
FIG. 10C depicts Vth distributions of a set of memory cells after programming, consistent with step 808 of FIG. 8A.

FIG. 10C depicts Vth distributions of a set of memory cells after programming, consistent with step 808 of FIG. 8A. Starting from the erased state Vth distribution 1001, the memory cells are programmed to the A, B and C state Vth distributions 1010, 1020 and 1030, respectively, as in FIG. 10A. However, since the hole redistribution was accelerated by the positive control gate voltage, the Vth distributions remain above the respective verify levels and the downshifted Vth distributions 1011, 1021 and 1031 of FIG. 10A are avoided.

Figure 10D:
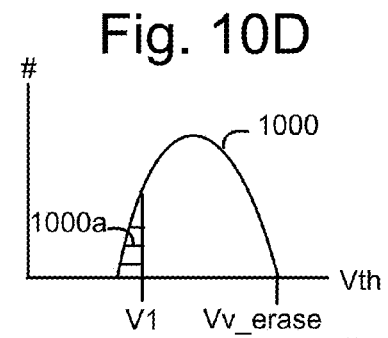
FIG. 10D depicts a portion of the Vth distribution of the erased state for which memory cells have a Vth<V1, before biasing of memory cells to accelerate redistribution of holes, consistent with step 805 of FIG. 8A.

FIG. 10D depicts a portion of the Vth distribution of the erased state for which memory cells have a Vth<V1, before biasing of memory cells to accelerate redistribution of holes, consistent with step 805 of FIG. 8A. When the erase-verify iterations are completed, the lower tail of the Vth distribution of the erased state can be measured. V1 is an example voltage which is expected to be within the lower tail. V1 is applied to the memory cells while a current through the NAND string is sensed. The NAND strings which have memory cells with a Vth<V1 (based on the sensed NAND string current being above a reference current) are represented by the region 1000a of the Vth distribution 1000. The lower tail can be considered to be relatively lower (and the erase relatively deeper) when a portion of the NAND strings which have cells with a Vth<V1 is relatively greater. For example, if there are 100 NAND strings being erased, and 10 of them have cells with a Vth<V1, then the extent of the lower tail below V1 is relatively small. On the other hand, if there are 100 NAND strings being erased, and 40 of them have cells with a Vth<V1, then the extent of the lower tail below V1 is relatively large and the erase is relatively deeper.

As mentioned, the positive control gate voltage can be adjusted based on the depth of the erase.

Figure 10E:
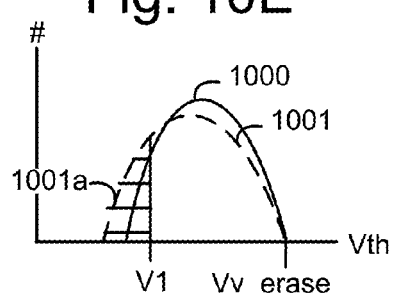
FIG. 10E depicts a portion of the Vth distribution of the erased state for which memory cells have a Vth<V1, after biasing of memory cells to accelerate redistribution of holes, consistent with step 811 of FIG. 8C.

FIG. 10E depicts a portion of the Vth distribution of the erased state for which memory cells have a Vth<V1, after biasing of memory cells to accelerate redistribution of holes, consistent with step 811 of FIG. 8C. In this case, the depth of the erase is determined after a positive control gate voltage is applied, to ascertain the effect of the positive control gate voltage and to determine whether an additional positive control gate voltage should be applied. The Vth distribution 1000 from FIG. 10A is repeated. The Vth distribution 1001 is obtained after a first positive control gate voltage. Again, note the lowering of the lower tail of the Vth distribution when a positive control gate voltage is applied.

As before, V1 is applied to the memory cells while a current through the NAND string is sensed. The NAND strings which have cells with a Vth<V1 are represented by the region 1001a of the Vth distribution 1001. If a portion of the NAND strings which have cells with a Vth<V1 is above a specified portion of all NAND strings involved in the erase operation, it may be concluded that the Vth distribution of the erased state has been sufficiently lowered (e.g., the erase depth of the set of memory cells is sufficiently deep) by the first positive control gate voltage, so that no further positive control gate voltage should be used. On the other hand, if the portion of the NAND strings which have cells with a Vth<V1 is below a specified portion of all NAND strings involved in the erase operation, it may be concluded that the Vth distribution of the erased state has not been sufficiently lowered (e.g., the erase depth of the set of memory cells is not sufficiently deep) by the first positive control gate voltage, so that an additional positive control gate voltage should be used.

Figure 10F:
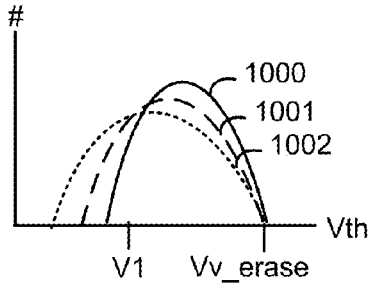
FIG. 10F depicts a decrease in the lower tail of the Vth distribution of the erased state in multiple steps, consistent with FIG. 8C.

FIG. 10F depicts a decrease in the lower tail of the Vth distribution of the erased state in multiple steps, consistent with FIG. 8C. The initial Vth distribution 1000 of the erased state is repeated. A first positive control gate voltage is applied, resulting in a lowering of the Vth distribution of the erased state from the Vth distribution 1000 to the Vth distribution 1001. A second positive control gate voltage is also applied, resulting in a further lowering of the Vth distribution of the erased state from the Vth distribution 1001 to the Vth distribution 1002, due to further hole redistribution in the charge-trapping material.

Accordingly, it can be seen that, in one embodiment, a method for operating a memory device comprises: performing a plurality of erase-verify iterations for a set of memory cells connected to a set of word lines until a verify test is passed by the set of memory cells, each memory cell of the set of memory cells comprises a charge-trapping material, the verify test determines whether memory cells of the set of memory cells have a threshold voltage which is below a verify voltage, and the set of memory cells has the threshold voltage distribution when the verify test is passed by the set of memory cells; and after the verify test is passed by the set of memory cells, biasing the set of memory cells to cause a lower tail of the threshold voltage distribution to move lower, the biasing the set of memory cells comprises providing a positive control gate-to-drain voltage for each memory cell in the set of memory cells.

In another embodiment, a memory device comprises: a set of memory cells connected to a set of word lines, each memory cell of the set of memory cells comprises a charge-trapping material; and a control circuit. The control circuit: performs an erase operation for the set of memory cells, wherein the set of memory cells has a threshold voltage distribution when the erase operation is completed, after the erase operation, performs biasing of the set of memory cells to cause a lower tail of the threshold voltage distribution to move lower by applying a positive control gate voltage to each word line of the set of word lines, and after the biasing of the set of memory cells, programs selected memory cells of the set of memory cells which are connected to a selected word line of the set of word lines using incremental step pulse programming, the incremental step pulse programming comprises an initial program voltage which is applied to the selected word line, wherein the positive control gate voltage has a magnitude which is less than one half of an initial program voltage of the incremental step pulse programming and has a duration which is at least ten times longer than a duration of the initial program voltage.

In another embodiment, a memory device comprises: a set of memory cells connected to a set of word lines, each memory cell of the set of memory cells comprises a charge-trapping material; and a control circuit. The control circuit is configured to: perform a plurality of erase-verify iterations for the set of memory cells until a verify test is passed by the set of memory cells, each memory cell of the set of memory cells comprises a charge-trapping material, the verify test determines whether memory cells of the set of memory cells have a threshold voltage which is below a verify voltage, and the set of memory cells has a threshold voltage distribution when the verify test is passed by the set of memory cells, count a number of erase-verify iterations in the plurality of erase-verify iterations, and after the verify test is passed by the set of memory cells, apply a positive control gate voltage to each word line of the set of word lines, wherein the positive control gate voltage has a duration which is relatively shorter when the count is relatively lower.

In another embodiment, a memory device comprises: a set of memory cells connected to a set of word lines, each memory cell of the set of memory cells comprises a charge-trapping material; and a control circuit. The control circuit is configured to perform a plurality of erase-verify iterations for the set of memory cells until a verify test is passed by the set of memory cells, the verify test determines whether memory cells of the set of memory cells have a threshold voltage which is below a verify voltage, and the set of memory cells has a threshold voltage distribution when the verify test is passed by the set of memory cells, and after the verify test is passed by the set of memory cells, the control circuit is configured to bias the set of memory cells to cause a lower tail of the threshold voltage distribution to move lower, the bias of the set of memory cells is achieved by providing a positive control gate-to-drain voltage for each memory cell in the set of memory cells.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a memory device, comprising:
performing a plurality of erase-verify iterations for a set of memory cells connected to a set of word lines until a verify test is passed by the set of memory cells, each memory cell of the set of memory cells comprises a charge-trapping material, the verify test determines whether memory cells of the set of memory cells have a threshold voltage which is below a verify voltage, and the set of memory cells has a threshold voltage distribution when the verify test is passed by the set of memory cells; and
after the verify test is passed by the set of memory cells, biasing the set of memory cells to cause a lower tail of the threshold voltage distribution to move lower, the biasing the set of memory cells comprises providing a positive control gate-to-drain voltage for each memory cell in the set of memory cells.

2. The method of claim 1, further comprising:
after the biasing of the set of memory cells, programming selected memory cells of the set of memory cells which are connected to a selected word line of the set of word lines using incremental step pulse programming, the incremental step pulse programming comprises an initial program voltage which is applied to the selected word line; wherein:
the providing the positive control gate-to-drain voltage for each memory cell in the set of memory cells comprises applying a positive control gate voltage to each word line of the set of word lines; and
the positive control gate voltage has a magnitude which is less than one half of an initial program voltage of the incremental step pulse programming and has a duration which is at least ten times longer than a duration of the initial program voltage.

3. The method of claim 2, wherein:
the programming of the selected memory cells occurs without soft programming of the selected memory cells.

4. The method of claim 1, wherein:
the memory cells of the set of memory cells are arranged in a set of NAND strings;
each NAND string of the set of NAND strings is connected to a bit line in a set of bit lines; and
the providing the positive control gate-to-drain voltage for each memory cell in the set of memory cells comprises setting each bit line in the set of bit lines to a fixed level which is less than the positive control gate voltage.

5. The method of claim 1, further comprising, after the biasing of the set of memory cells, programming selected memory cells of the set of memory cells which are connected to a selected word line of the set of word lines, wherein:
the providing the positive control gate-to-drain voltage for each memory cell in the set of memory cells comprises applying a positive control gate voltage to each word line of the set of word lines;
the memory cells of the set of memory cells are arranged along vertical pillars which extend in a three-dimensional memory structure;
the vertical pillars have varying cross-sectional widths along a height of the three-dimensional memory structure;
the positive control gate voltage has a duration which is a function of a height of the selected word line in the memory device; and
the duration is relatively shorter when the height is associated with a relatively smaller cross-sectional width of the vertical pillars.

6. The method of claim 1, wherein the providing the positive control gate-to-drain voltage for each memory cell in the set of memory cells comprises applying a positive control gate voltage to each word line of the set of word lines, the method further comprising:
counting a number of erase-verify iterations in the plurality of erase-verify iterations which are used before the verify test is passed by the set of memory cells, wherein the positive control gate voltage has a duration which is relatively shorter when the count is relatively lower.

7. The method of claim 1, further comprising:
maintaining a count of program-erase cycles of the set of memory cells, wherein the positive control gate voltage has a duration which is relatively shorter when the count is relatively lower.

8. The method of claim 1, further comprising:
sensing a position of the lower tail of the threshold voltage distribution, wherein the positive control gate voltage has a duration which is relatively shorter when the position is relatively higher.

9. The method of claim 1, wherein:
the providing the positive control gate-to-drain voltage for each memory cell in the set of memory cells comprises providing a first control gate-to-drain voltage for a memory cell in the set of memory cells, followed by determining an erase depth of the set of memory cells, followed by providing a second control gate-to-drain voltage for the memory cell in the set of memory cells if the erase depth of the set of memory cells is not sufficiently deep.

10. The method of claim 9, wherein:
the memory cells of the set of memory cells are arranged in NAND strings; and
the determining the erase depth comprises sensing currents in the NAND strings and comparing the currents to a reference current, wherein the currents are indicative of threshold voltage levels.

11. The method of claim 10, further comprising:
during the sensing of the currents in the NAND strings, providing a positive source-to-control gate voltage of the memory cells of the set of memory cells.

12. A memory device, comprising:
a set of memory cells connected to a set of word lines, each memory cell of the set of memory cells comprises a charge-trapping material; and
a control circuit, the control circuit:
performs an erase operation for the set of memory cells, wherein the set of memory cells has a threshold voltage distribution when the erase operation is completed, after the erase operation, performs biasing of the set of memory cells to cause a lower tail of the threshold voltage distribution to move lower by applying a positive control gate voltage to each word line of the set of word lines, and after the biasing of the set of memory cells, programs selected memory cells of the set of memory cells which are connected to a selected word line of the set of word lines using incremental step pulse programming, the incremental step pulse programming comprises an initial program voltage which is applied to the selected word line, wherein the positive control gate voltage has a magnitude which is less than one half of an initial program voltage of the incremental step pulse programming and has a duration which is at least ten times longer than a duration of the initial program voltage.

13. The memory device of claim 12, wherein the erase operation comprises a plurality of erase-verify iterations, the erase operation is completed when a verify test is passed by the set of memory cells, and the control circuit is configured to:

count a number of erase-verify iterations in the plurality of erase-verify iterations which are used before the verify test is passed by the set of memory cells, wherein the positive control gate voltage has a duration which is relatively shorter when the count is relatively lower.

14. The memory device of claim 12, wherein:
the memory cells of the set of memory cells are arranged along vertical pillars which extend in a three-dimensional memory structure;
the vertical pillars have varying cross-sectional widths along a height of the three-dimensional memory structure;
the positive control gate voltage has a duration which is a function of a height of the selected word line in the memory device; and
the duration is relatively shorter when the height is associated with a relatively smaller cross-sectional width of the vertical pillars.

15. The memory device of claim 12, wherein:
the control circuit maintains a count of program-erase cycles of the set of memory cells; and
the positive control gate voltage has a duration which is relatively shorter when the count is relatively lower.

16. The memory device of claim 12, wherein:
after the applying the positive control gate voltage to each word line of the set of word lines, the control circuit determines an erase depth of the set of memory cells, and applies an additional control gate voltage to each word line of the set of word lines if the erase depth of the set of memory cells is not sufficiently deep.

17. A memory device, comprising:
a set of memory cells connected to a set of word lines, each memory cell of the set of memory cells comprises a charge-trapping material; and a control circuit, the control circuit is configured to:
perform a plurality of erase-verify iterations for the set of memory cells until a verify test is passed by the set of memory cells, each memory cell of the set of memory cells comprises a charge-trapping material, the verify test determines whether memory cells of the set of memory cells have a threshold voltage which is below a verify voltage, and the set of memory cells has a threshold voltage distribution when the verify test is passed by the set of memory cells,
count a number of erase-verify iterations in the plurality of erase-verify iterations, and
after the verify test is passed by the set of memory cells, apply a positive control gate voltage to each word line of the set of word lines, wherein the positive control gate voltage has a duration which is relatively shorter when the count is relatively lower.

18. The memory device of claim 17, wherein:
after the positive control gate voltage is applied to each word line of the set of word lines, the control circuit is configured to program selected memory cells of the set of memory cells which are connected to a selected word line of the set of word lines using incremental step pulse programming;
the incremental step pulse programming comprises an initial program voltage which is applied to the selected word line; and
the duration of the positive control gate voltage is at least ten times longer than a duration of the initial program voltage.

19. The memory device of claim 17, wherein:
after the positive control gate voltage is applied to each word line of the set of word lines, the control circuit is configured to program selected memory cells of the set of memory cells which are connected to a selected word line of the set of word lines using incremental step pulse programming; and
the control circuit is configured to program the selected memory cells without soft programming of the selected memory cells.

20. The memory device of claim 17, wherein:
after the positive control gate voltage is applied to each word line of the set of word lines, the control circuit is configured to program selected memory cells of the set of memory cells which are connected to a selected word line of the set of word lines using incremental step pulse programming;
the incremental step pulse programming comprises an initial program voltage which is applied to the selected word line; and
the positive control gate voltage has a magnitude which is less than one half of an initial program voltage of the incremental step pulse programming.

21. The memory device of claim 20, wherein:
the duration of the positive control gate voltage is at least ten times longer than a duration of the initial program voltage.

* * * * *